US009524858B2

(12) United States Patent
Schanen

(10) Patent No.: US 9,524,858 B2
(45) Date of Patent: Dec. 20, 2016

(54) ANALYTICAL APPARATUS UTILIZING ELECTRON IMPACT IONIZATION

(71) Applicant: MARKES INTERNATIONAL LIMITED, Pontyclun (GB)

(72) Inventor: Pierre Schanen, Gilching (DE)

(73) Assignee: Markes International Limited, Llantrisant (GB)

( * ) Notice: Subject to any disclaimer, the term of this patent is extended or adjusted under 35 U.S.C. 154(b) by 62 days.

(21) Appl. No.: 14/767,920

(22) PCT Filed: Feb. 19, 2014

(86) PCT No.: PCT/GB2014/050486
§ 371 (c)(1),
(2) Date: Aug. 14, 2015

(87) PCT Pub. No.: WO2014/128462
PCT Pub. Date: Aug. 28, 2014

(65) Prior Publication Data

US 2015/0380228 A1 Dec. 31, 2015

(30) Foreign Application Priority Data

Feb. 19, 2013 (GB) .................................. 1302818.8

(51) Int. Cl.
*H01J 37/08* (2006.01)
*H01J 49/14* (2006.01)
*H01J 27/20* (2006.01)

(52) U.S. Cl.
CPC ............ *H01J 49/147* (2013.01); *H01J 27/205* (2013.01)

(58) Field of Classification Search
USPC ... 250/281, 286, 288, 292, 423 R, 424, 427; 315/42, 111.31, 111.81; 313/231.31
See application file for complete search history.

(56) References Cited

U.S. PATENT DOCUMENTS 5,294,797 A * 3/1994 Frey ...................... H01J 49/147 250/286
5,374,828 A 12/1994 Boumsellek et al.
(Continued)

FOREIGN PATENT DOCUMENTS

JP H02121233 A 5/1990
WO 2005003717 A2 1/2005

OTHER PUBLICATIONS

"Wehnelt Cylinder," Wikipedia, Apr. 11, 2012, http://en.wikipedia.org/w/index.php?title=Wehnelt_cylinder&oldid=486823106.
(Continued)

*Primary Examiner* — Bernard Souw
(74) *Attorney, Agent, or Firm* — Troutman Sanders LLP; Ryan A. Schneider; Chris N. Davis

(57) ABSTRACT

An analytical apparatus (1) for mass spectrometry comprises an electron impact ioniser including an electron emitter (22) and an ionisation target zone (18). The target zone (18) is arranged to be populated with matter to be ionised for analysis. An electron extracting element (36) is aligned with an electron pathway (34) defined between the electron emitter (22) and the ionisation target zone (18). The electron extracting element (36) is configured to accelerate electrons away from the emitter (22) along the electron pathway (34) between the emitter (22) and the extracting element (36) and to decelerate the electrons along the electron pathway (34) between the extracting element (36) and the ionisation target zone (18) to enable soft ionisation while avoiding the effects of coulombic repulsion at the electron source (22).

25 Claims, 8 Drawing Sheets

(56) References Cited

U.S. PATENT DOCUMENTS

| | | | | |
|---|---|---|---|---|
| 5,387,843 | A | 2/1995 | Nagayama et al. | |
| 6,919,562 | B1 | 7/2005 | Whitehouse et al. | |
| 2004/0000647 | A1 | 1/2004 | Horsky | |
| 2004/0104682 | A1 | 6/2004 | Horsky et al. | |
| 2005/0051096 | A1 | 3/2005 | Horsky et al. | |
| 2005/0184735 | A1 | 8/2005 | Arnold et al. | |
| 2007/0194252 | A1 * | 8/2007 | Horsky .................... | H01J 37/08<br>250/492.21 |

OTHER PUBLICATIONS

International Search Report in related PCT Application No. PCT/GB2014/050486, mailed Oct. 27, 2014.

Search Report in related GB Application No. GB1302818.8, mailed Aug. 19, 2013.

* cited by examiner

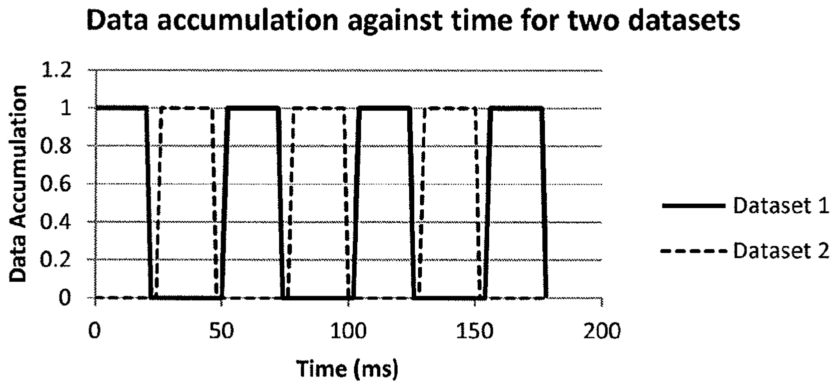
Fig. 8: Data accumulation against time for scan rate of 50Hz. Each scanset comprises 200 scans and is recorded every 20ms. Solid line = 1st data set acquired at 1st ionisation voltage and dashed line = 2nd data set set.

ANALYTICAL APPARATUS UTILIZING ELECTRON IMPACT IONIZATION

CROSS-REFERENCE TO RELATED APPLICATIONS

This application is a US National Stage of International Application No. PCT/GB2014/050486, filed 19 Feb. 2014, which claims the benefit of GB1302818.8, filed 19 Feb. 2013, both herein fully incorporated by reference.

The present invention relates to an analytical apparatus and in particular a mass spectrometry system including an electron impact ioniser.

Mass spectrometry (MS) is a commonly used analytical technique for determining the mass of particles. MS can also be used to determine the elemental composition of a sample or molecule by analysing its constituent parts, and to provide an insight into the chemical structures of molecules, for example complex hydrocarbon chains. A mass spectrometer determines the mass of a particle by measuring its mass-to-charge ratio. This method requires the particles to be charged, and a mass spectrometer therefore operates by ionising samples in an ion source to generate charged molecules and/or molecular fragments and then measuring the mass-to-charge ratios of these ions.

Uncharged particles (neutrals) cannot be accelerated by an electric field. It is therefore necessary that all particles to be analysed by mass spectrometry are ionised. A typical ionisation technique is electron ionisation (EI), also referred to as electron impact ionisation, in which a source of gas phase neutral atoms or molecules is bombarded by electrons. The electrons are normally generated through thermionic emission in which an electric current is passed through a wire filament to heat the wire causing the release of energetic electrons. The electrons are then accelerated towards the ion source using a potential difference between the filament and the ion source.

EI is a routinely used technique usually intended for the analysis of low-mass, volatile, thermally stable organic compounds. EI is normally performed at an electron energy value of 70 eV as this presents high ionisation efficiency and an analytical means of standardisation across different MS instruments offering this ionisation technique. However, at an electron energy of 70 eV the energy transferred from the accelerated electrons to the sample molecules during ionisation impact is sufficient to break bonds within the analyte molecule causing it to 'fragment' into several smaller ions. Ordinarily this is desirable, since the energy deposition causing molecular fragmentation is reproducibly standardised such that the pattern of fragment ions, the 'mass spectrum' of a given analyte, is sufficiently similar on different instruments to yield an analytical fingerprint for the analyte. The level of fragmentation is such that, for many chemical classes of analytes, the original molecule (or 'molecular ion') often cannot be seen or is very small. For this reason EI is known as a 'hard' ionisation technique.

For mixtures of analytes, a hyphenating analytical technique such as gas chromatography (GC) is often interfaced to the mass spectrometer, enabling highly complex mixtures of analytes to be separated in time and sequentially admitted to the ion source. But even with analytical hyphenation, the complexity of the sample may be overwhelming and cause many superimposed mass spectra to be generated which cannot be unravelled and collectively defy analytical discrimination. Therefore it is often desirable to reduce the degree of fragmentation by reducing the energy of the electron ionisation. However, if the electron energy is lowered by reducing the electron acceleration voltage a marked decrease in ion production is experienced in part due to a decrease in the concentration of electrons in the ion source as the electrical field is insufficient to accelerate significant numbers of electrons away from the filament in a concentrated path, and in part to a reduced ionisation efficiency at electron energies below 70 eV. The latter effect is shown in FIG. 1, which charts ionisation probability vs. electron energy for some example molecules. A peak is displayed at around 70 eV and the sensitivity below 70 eV decreases sharply until a level is reached, typically at around 15 eV, where the results are usually not analytically useful.

By increasing the current of the electron emission filament, the population of electrons generated will increase and the ion flux may also increase, leading to some improvement in sensitivity at lowered electron energies. However, at large filament currents the high densities of electrons close to the filament causes Coulombic repulsion (called Space Charge Limited Emission, also known as Child-Langmuir Law in the case of planar geometry), where the repulsive forces between the high density electrons proximal to the filament itself prevent further electrons from being released. This results in an electron flux plateau. Furthermore, in regions of high electron density around the filament, the electrons which have been released are also repelled from one another. This results in a broadening of the electron beam which can reduce the accuracy with which the electrons are focused into the ion source and therefore the level of ionisation. This issue is amplified when the electrons have lower kinetic energy due to a lower applied potential difference, as their momentum in the direction of the ion source is decreased. As such, increased filament current may only provide a limited improvement in ionisation efficiency.

Chemical ionisation is a known 'soft' ionisation technique. Chemical ionisation requires the use of large quantities of a reagent gas such as methane and the ionisation energy is dependent on the reagent gas used. Therefore the ionisation energy is not easily adjustable. Standardisation of spectra can also be difficult with this method due to a shortage of libraries to search.

A number of alternative soft ionisation techniques have been applied to GC/MS measurements. These include resonance-enhanced multi photon ionisation (REMPI) and the more universal single photon ionisation (SPI). These soft ionisation methods cause little or no fragmentation of the molecular ion which have been applied to sources in GC/MS instruments. Another soft ionisation technique uses the cooling of the molecules in a supersonic molecular beam (SMB). A SMB is formed by the expansion of a gas through a pinhole into a vacuum chamber resulting in the cooling of the internal vibrational degrees of freedom. SMB is used as an interface between a GC and an MS and combined with electron impact ionisation lead to enhanced molecular ion signals and can therefore be regarded as a soft ionisation method.

Such 'soft' ionisation techniques provide soft ionisation only and cannot be utilised to also provide harder ionisation if such is required. US2009/0218482 describes a system which provides both hard and soft ionisation using electron pulses to create hard electron ionisation of the analyte molecules and photon pulses to provide soft photo ionisation. These two techniques are implemented simultaneously with the electron ionisation being repeatedly switched 'on' and 'off' in a pulsed manner to switch between the soft and hard ionisations. However, the hardware requirements for such a system are significant with both electron and photon generation means being required together with the associated delivery and focusing set up for each technique. The cost of such a dual system is therefore prohibitive and the amount and size of equipment required to implement both ionisation techniques significantly increase the space required for such a system.

It is therefore desirable to provide an improved ionisation apparatus and method for the ionisation of an analyte sample which addresses the above described problems and/or which offers improvements generally.

According to the present invention there is provided an electron ionisation apparatus as described in the accompanying claims There is also provided a mass spectrometer with an ionisation apparatus as defined by the accompanying claims.

In an embodiment of the invention there is provided an electron impact ionisation apparatus comprising an electron emitter; an ionisation target zone arranged to be populated with sample matter to be ionised and an electron extractor arranged between the electron emitter and the ionisation target zone comprising an electrically conductive element to which a voltage is applied such that the potential difference between the electron emitter and the electron extractor is greater than the potential difference between the electron emitter and the ionisation target zone. The extractor functions as an accelerator drawing electrons away from the electron emitter to prevent Coulombic repulsion limiting electron emission. The enhanced acceleration field with an extractor allows a higher electron flux from the emitter as compared to the acceleration field between emitter and target zone alone. The energy of the electrons in the target zone will however not be changed by the extractor as this energy is defined by the potential difference between the electron emitter and the ionisation target zone. As a consequence of this the electrons will be decelerated between extractor and target zone. In this way, 'soft' electron ionisation may be achieved without loss of sensitivity due to the maintenance of high electron density at the ionisation target zone.

The electron extractor consists of a plate or grid. The electron extractor plate is preferably arranged substantially perpendicular to the electron pathway.

Apart from extracting the electrons the extractor may also be used to modulate or stop the electron beam by applying different, preferentially negative voltages, during different time intervals.

The electron ionisation apparatus may further comprise an electron reflector arranged to repel electrons emitted from the electron emitter substantially in the direction of the ionisation target zone. The electron reflector may be an electrically chargeable element configured to be negatively charged and is provided on the opposing side of the electron generator to the ionisation target zone such that when negatively charged the reflector repels electrons in the direction of the ionisation target zone to cause ionisation of material therein. The electron reflector combines with the ionisation target zone to create a positive potential difference in the direction of the ionisation target zone to drive electrons in the direction of the target zone.

Apart from reflecting the electrons towards the target zone the electron reflector may also be used to modulate or stop the electron beam by applying different, preferentially positive voltages, during different time intervals.

The electron ionisation apparatus may further comprise an electron focusing element aligned with the electron pathway and located between the electron emitter and the ionisation target zone which is arranged to focus and direct the electrons towards the target zone. The electron focusing element may be electrically chargeable and configured to be negatively charged. By focusing the electrons from the electron emitter along an electron pathway to the ionisation target zone the electron density incident at the ionisation target zone is increased and hence the ionisation efficiency is correspondingly increased.

An electron pathway is preferably defined between the electron emitter and the ionisation target zone and the electron focusing element comprises a focusing aperture which is aligned with the electron pathway. In this way the electrons are focused through the aperture towards the target zone. The electron focusing element may comprise an electrically conductive plate having the focusing aperture extending therethrough. The electron focusing element may be situated between emitter and extractor or between extractor and target zone.

Apart from focusing the electrons the focusing element may also be used to modulate or stop the electron beam by applying different, preferentially negative voltages, during different time intervals.

In a preferred configuration the electron focusing element is placed in proximity of the electron emitter or surrounds it partially. Placing the focusing element in proximity or surrounding the emitter with a portion of the focusing element minimises lateral drift of electrons from the point of emission and maximises the number of electrons directed along the electron pathway.

The electron focusing element may comprise a main body section and an extension section extending from the surface of the main body section in the direction of the electron to emitter, the extension section defining an enclosure having one open end near or surrounding the electron emitter and the other open end contiguous with the aperture of the main body section. Preferably the main body and the extension section define a top-hat configuration with the extension section near or surrounding the emitter. The top-hat configuration is advantageous where space surrounding the emitter is limited as it provides a reduced wall thickness in the area surrounding the emitter.

The electron emitter preferably comprises an electric filament configured to be heated to generate electrons through thermionic emission.

The electron ionisation apparatus may further comprise a magnetic focusing element at both sides of the electron pathway generating a magnetic field between electron emitter and target zone such that the electron beam is focused and confined along the centre of the beam.

The electron ionisation apparatus may further comprise an ionisation chamber having an internal volume defining the ionisation target zone, the chamber comprising an electron inlet aperture aligned with electron pathway arranged to permit entry of electrons emitted from the electron emitter into the ionisation chamber, and a gas inlet configured to permit the flow of gas phase molecules into the chamber for ionisation.

The present invention will now be described by way of example only with reference to the following illustrative figures in which:

FIG. 8 shows data accumulation against time for two data sets.

Figure 1:
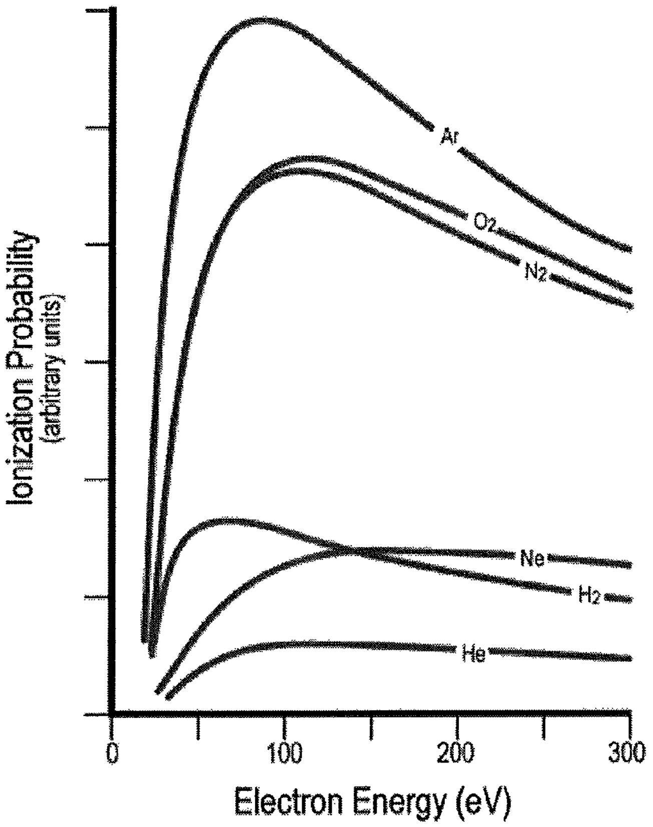
FIG. 1 is a graph showing the effect of electron energy on ionisation efficiency.
Figure 2:
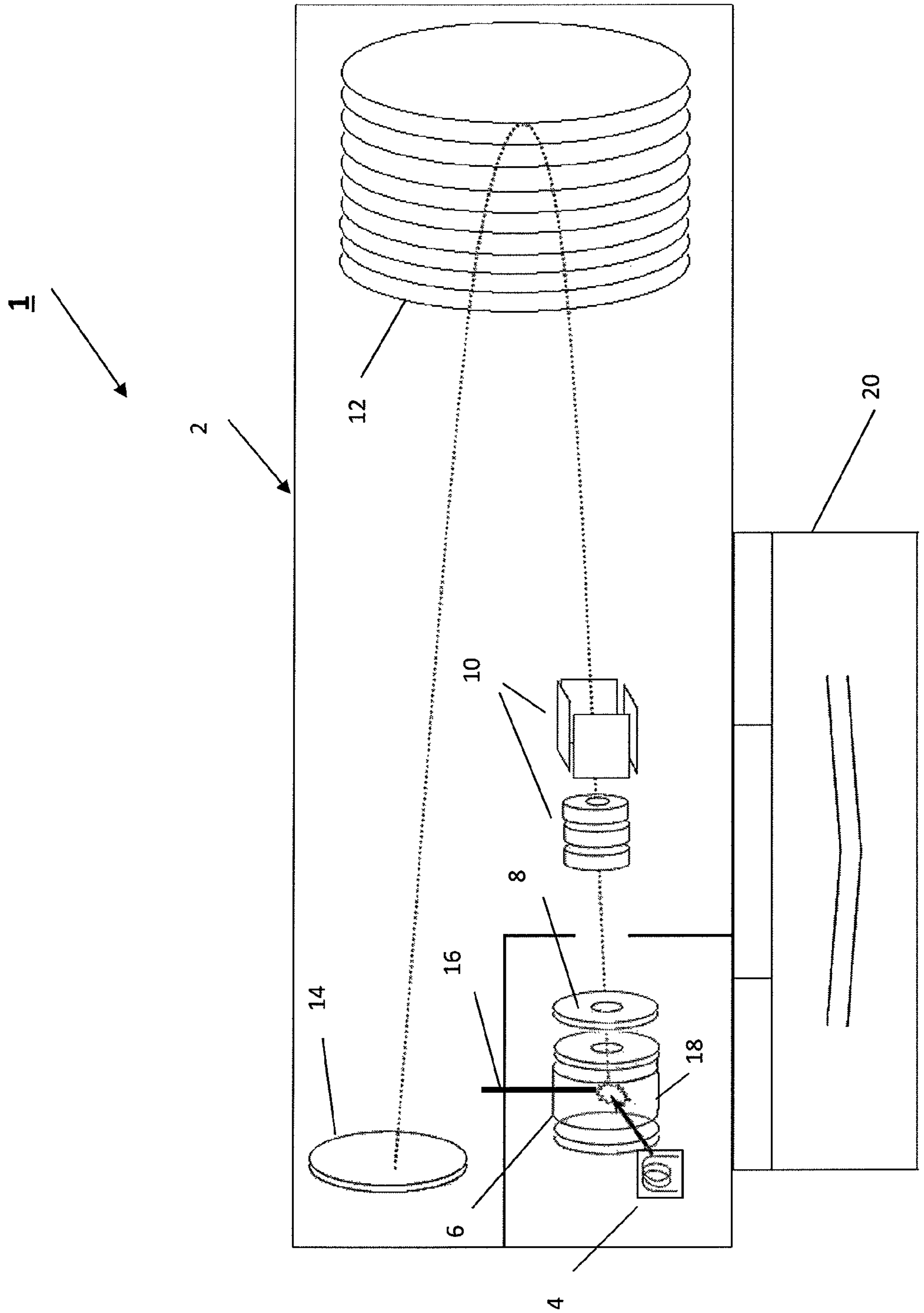
FIG. 2 shows a mass spectrometer with an electron ionisation apparatus according to an embodiment of the present invention, the apparatus is symbolised as a box.

In the embodiment shown in FIG. 2 a TOF mass spectrometer is used to analyse the analyte molecules and the combination of this technique with the ionisation system of the present invention is described by way of one example of the use of the system for analysis of analyte molecules. Referring to FIG. 2 a Time of Flight (TOF) mass spectrometer 1 comprises a vacuum chamber 2 pumped by a vacuum pump 20 and containing an electron generator 4, an ion source 6, accelerator plates 8, ion optics 10 a reflector 12 and a detector 14. An analyte is introduced to the TOF following initial chromatographic separation in a gas chromatograph (GC). The GC (not shown) is connected to the TOF 1 by a gas inlet line 16. The gas inlet line 16 is a heated transfer line and the analyte source flows from the GC column through the gas inlet 16 and into the ion source chamber 18. The analyte source comprises a gas flow containing molecules from the GC, the mass to charge ratio of which is to be determined by the TOF 1.

Figure 3:
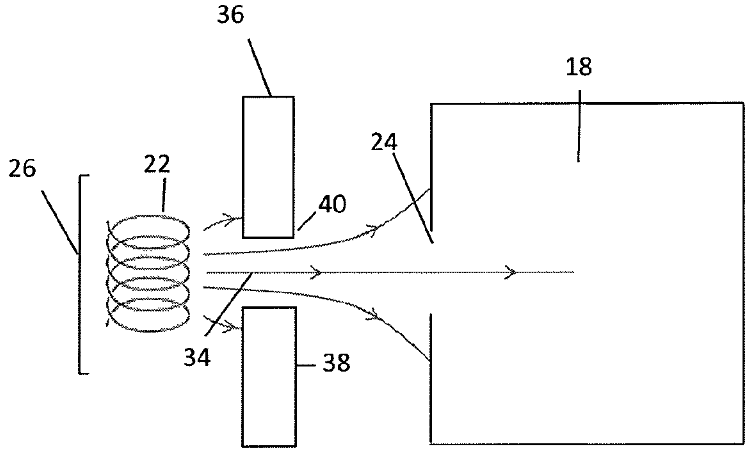
FIG. 3 shows a schematic representation of a first embodiment of the electron ionisation apparatus of FIG. 2.

As shown in FIG. 3, the electron source 4 comprises a filament 22 connected to an electrical power source. The filament 22 is configured such that when an electrical current is passed through the filament, large quantities of electrons are produced and omitted from the filament 22 through thermionic emission. The filament 22 is located outside of the ion source chamber 18. The filament 22 is spaced from the source chamber 18 and aligned with an aperture 24 in the chamber 18 which is configured to permit electrons to pass into the source chamber 18.

In electron impact ionisation systems of the prior art an accelerating voltage of 70V is used to accelerate the electrons towards the ion chamber with an energy of 70 eV. However it has been found that this accelerating voltage of 70V can result in over fragmentation of the analyte molecules making it difficult to distinguish between two or more simultaneously ionised substances due to interferences between their fragmentation patterns. Lowering the accelerating voltage to, for example, around 15V reduces the kinetic energy of the electron beam allowing for a “softer” ionisation. This decreases the degree of fragmentation, allowing the molecular ions to become more prevalent. However, when using these lower accelerating voltages the ionisation probability has been found to fall away sharply. One reason for this is that the lower accelerating voltage is insufficient to pull a significant number of electrons away from the area of the filament, with large quantities of the electron cloud surrounding the filament drifting in directions away from the ion chamber due to coulombic effects which gain in importance at lower acceleration voltages. The other reason is that further electron production from the filament is suppressed by Coulombic repulsion of the already existing electron cloud (space charge limited emission). As such, the electron density at the ion chamber 18 is reduced.

To counter this problem, an electron extractor, or extractor lens 36 is provided in close proximity to the filament 22 at a location between the filament 22 and the ion chamber 18. The term ‘lens’ is used as the extractor may provide a focusing function but this term is non-limiting and it is not essential that the extractor 36 focuses the electrons. The extractor 36 comprises a metallic plate 38 having a centrally located aperture 40. In an alternative embodiment the extractor may be a metallic grid or a frame with a metallic grid, or a plate having a plurality of apertures. The extractor 36 is arranged such that the plate or grid 38 is substantially perpendicular to the path of the electron beam 34 with the aperture or grid 40 being aligned with the path of the electron beam 34 such that electrons from the filament 22 travelling along the electron beam path 34 are permitted to pass through the aperture 40 and onwards to the ion chamber 18. The direct line of sight between the filament 22 and the opening 24 of the ion source chamber 18, comprising the shortest distance between the two, defines an electron beam path 34.

At a low acceleration voltage coulombic effects around the filament 22 can lead to a condition where the density of electrons in the region of the filament 22 is sufficient to prevent the production of further electrons Therefore, in order to overcome the coulombic repulsion of the electron cloud surrounding the filament the extractor 36 is charged to create a positive potential difference between the filament 22 and the extractor 36 that is greater than the potential difference between the filament 22 and the ion chamber 18. This larger potential difference acts to accelerate the electrons away from the filament 22 at a much higher rate than is achieved by the potential difference between the filament 22 and the ion chamber 18 alone, thereby reducing the electron density in the region of the filament 22, preventing coulombic repulsion from inhibiting electron emission and hence maximising the electron production from the filament.

Once the electrons have passed through the aperture 40 of the extractor 36 their momentum decreases as they are decelerated back to the energy corresponding to the potential difference between filament 22 and ion chamber 18.

Preferably the potential difference between the filament 22 and the ion chamber 18 is selected to be in the range of 5-30V thereby resulting in electron energies at the ion chamber in the range of 5-30 eV. Below this range the electron energy is too low to cause ionisation of the analyte molecules, whereas above this range fragmentation begins to occur. A yet more preferable range has been identified as being 5-25V with an electron energy range of 5-25 eV, and more preferably again the system is operated at an electron energy of 14 eV.

A reflecting plate 26 can be mounted behind the filament 22 on the opposing side of the filament 22 from the source chamber 18 such that the filament 22 is located between the source chamber 18 and the reflecting plate 26. The reflecting plate 26 is negatively charged such that the negatively charged electrons are repelled away from the reflecting plate 26 in the general direction of the ion source chamber 18. It is contemplated that in an alternative embodiment the apparatus may function without a reflecting plate, which is possible due to the extraction force applied by the extractor 36. The reflector can however provide increased efficiency by reducing electron losses in a direction away from the electron pathway.

The electron beam 34 and gas inlet 16 to the ion chamber 18 are arranged such that the electron beam 34 enters the ion source chamber 18 substantially perpendicular to the flow of analyte into the ion chamber 18 from the gas inlet 16.

Within the ion source chamber 18 the energetic electrons interact with the gas phase analyte molecules to produce ions. When the electrons are passing in close proximity to the analyte molecules energy is transferred from the electrons to the analyte molecules causing ionisation of the molecule. This method is known as electron ionisation (EI). In the situation where fragmentation occurs, the level of fragmentation depends on the amount of energy transferred from the electron to the analyte molecule, which is in turn dependent on the energy of the incoming electrons. Therefore, by reducing the energy of the incoming electrons to a lower level, the fragmentation of the analyte is significantly reduced resulting in a larger concentration of unfragmented molecular ions.

Once the ions have been generated within the ion source chamber 18, which may be any suitable volume within which ions are generated for onward analysis, ions are ejected and then onwardly processed depending on the analysis technique to be used. In the embodiment shown in FIG. 2 a TOF mass spectrometer is used to analyse the analyte molecules.

Figure 4:
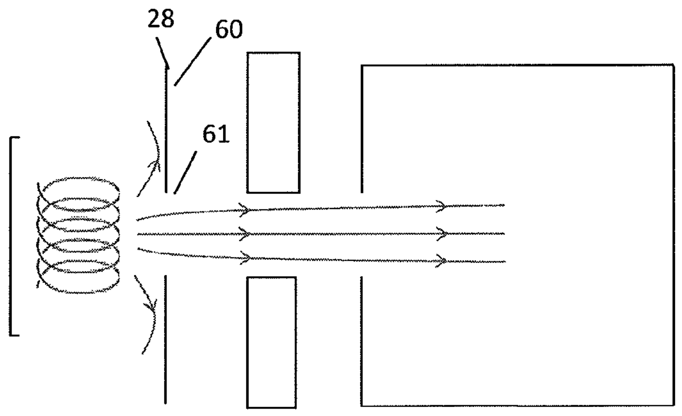
FIG. 4 shows the electron ionisation apparatus of FIG. 3 further including a focusing lens according to an embodiment of the present invention.

In the embodiment shown in FIG. 4 the system further comprises a focusing lens 28 to focus the electron beam to increase electron density at the ion source chamber. The electron focusing lens 28 comprises a metallic plate 60 having a central aperture 61 formed therein. The aperture 61 is preferably of circular shape. The aperture 61 is located on the direct line of sight between the filament 22 and the opening 24 of the ion source chamber 18. The electron focusing lens 28 is arranged such that the plate 60 is substantially perpendicular to the path of the electron beam 34 with the aperture 61 being aligned with the path of the electron beam 34 such that electrons from the filament 22 travelling along the electron beam path 34 are permitted to pass through the aperture 61 and onwards to the ion chamber 18.

The plate 60 of the electron focusing lens 28 is biased to a negative voltage. The negative voltage bias of the plate 60 creates a repulsive electrostatic field that acts to condense and focus the cloud of electrons omitted from the filament 22 through the aperture 61 and along the electron beam path 34. In this way any broadening of the electron beam is countered by focusing the electrons using the electron focusing lens 28 and as a result the density of electrons along the electron path 34 is significantly increased. The number of electrons entering the ion chamber 18 is therefore increased and hence the probability of collision with analyte molecules resulting in ionisation rises accordingly.

Figure 5:
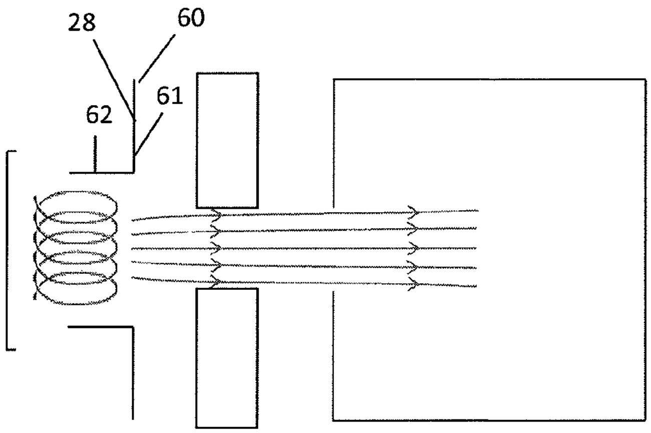
FIG. 5 shows the electron ionisation apparatus of FIG. 3 including an alternative electron focusing lens according to a further embodiment of the present invention.

In a further embodiment shown in FIG. 5 the electron focusing lens 28 includes an additional focusing element 62. Preferably, the focusing element 62 comprises an upstanding wall circumferentially extending around the periphery of the aperture 61 and projecting from the surface of the disc 60 proximal to the filament 22. The focusing element 62 is substantially cylindrical in shape having its proximal end relative to the filament 22 open and its distal end contiguous with the aperture 61 of the lens 28. The focusing element 62 is preferably positioned such that it surrounds the filament 22 defining a channel surrounding the filament and extending between the filament 22 and the aperture 61 of the lens 28. In combination with the plate 60 the focusing element 62 forms a substantially 'top-hat' configuration. The top hat configuration enables the electron focusing lens 28 to be extended further towards and preferably over the filament 22. The 'top hat' shape increases funneling of the electrons and decreases the amount of time the electrons can propagate and tangentially diverge before being focused, thereby increasing electron density in the electron path 34. This is particularly important at the lower electron energies used in the present invention where electrons are subject to relatively higher tangential forces on generation and so their divergence is larger.

Figure 6:
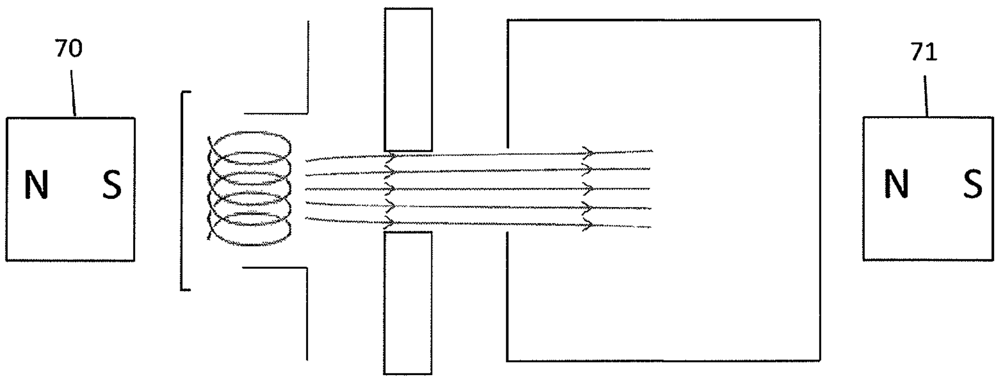
FIG. 6 shows the electron ionisation apparatus of FIG. 5 including magnetic focusing elements.

In a further embodiment shown in FIG. 6 fixed magnets 70 and 71 are provided for the embodiments in FIGS. 3 to 5 with the poles arranged to create a magnetic field which acts on the electrons to focus them in a helical manner to further optimise ionisation probability.

Figure 7:
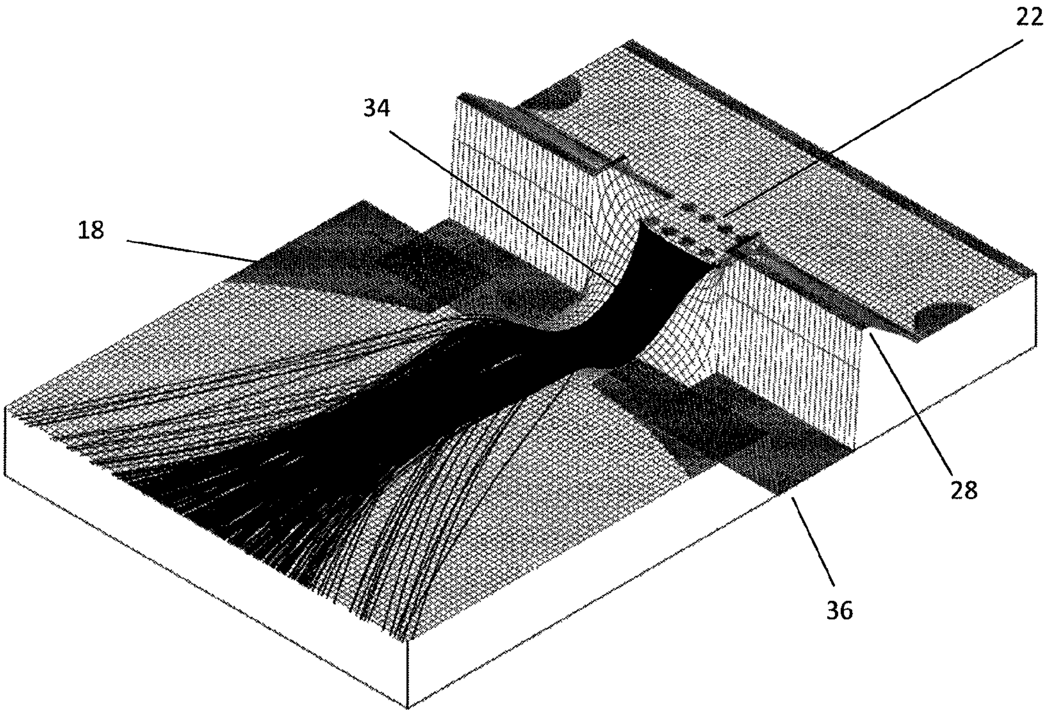
FIG. 7 is a field diagram showing the effects of the Electron focusing lens and extractor on electron velocity.

FIG. 7 shows an electrostatic field diagram representing the flow of electrons along the varying field between the filament and the ion source chamber. It can be seen that once the electrons are emitted from the filament 22 and have passed through the electron focusing lens 28 they accelerate rapidly towards the relatively positive potential difference of the extractor 36. This can be seen to cause a cascade of electrons away from the filament 22 thereby ensuring that the electron density immediately proximal to the filament 22 is maintained at suitably low levels promoting further electron production. Once the electron beam 34 passes through the extractor 36 it is subject to the potential difference between the extractor 36 and the ion chamber 18 which causes rapid deceleration of the electrons until they reach the set electron energy defined by the potential difference between filament and ion chamber 18 at the point of entering the ion chamber 18.

Therefore, the use of a positive potential between the electron focusing lens 28 and ion source chamber 18 in the form of an extractor 36 improves signal by reducing coulombic effects and increasing the number of electrons produced by the filament. This gives improved instrument sensitivity at the lower ionisation energies needed for soft ionisation. The further embodiment in which the electron focusing lens 28 is wrapped around the filament by means of a focusing element 62 has been shown to bring further signal enhancements. In addition, by staying below the ionisation energies of atmospheric gases, such as $N_2$, $O_2$, $CO_2$, $H_2O$, etc., this ionisation method is suitable for real-time analysis (direct inlet of sample gas without GC separation), simplifying the necessary means for a direct inlet of atmospheric gases into the mass spectrometer. Furthermore, the above described soft electron ionisation technique is a universal ionisation method as compared for example to chemical ionisation. Apart from the lower ionisation energy it is non-specific to a large number of analytes. Therefore it is suitable for screening analysis with reduced background signal (e.g. suppressed ionisation of siloxanes from column bleed or atmospheric gases, but ionisation of all the relevant organic compounds).

The flexibility of electron ionisation allows for the application of switching or multiplexing multiple ionising voltages in one measurement. This gives the opportunity to simultaneously accumulate multiple sets of spectra, for example, one with hard ionisation (e.g. 70 eV), and another with softer ionisation (e.g. 15 eV). This could lead to increased levels of analytical information with little impact on cost, sensitivity, time, or the quantity of samples required.

For certain analysis it is desirable to be able to ionise the analyte molecules at two different ionisation energies. For example, for a given sample it may be desirable to obtain a first 'soft ionisation' data set and a second 'hard ionisation' data set for a given analyte source, with the first data set benefiting from decreased fragmentation and hence increased visibility of the molecular ions, while the harder ionisation provides increased ionisation efficiency and is able to be referenced against established data libraries.

There are several possibilities to stop or modulate the intensity of the electron beam in an embodiment according to FIGS. 3-6. This can be achieved by changing the voltage of one of the following elements: reflector 26, filament 22, focusing lens 28, extractor 36 and ion chamber 18. It also can be done by introducing an additional shutter lens or grid in the pathway 34 of the electron beam. By way of example only this is described using the focusing lens 28 as a modulator or shutter.

In addition to focusing the electrons, the electron focusing lens 28 may also be configured to be used as a 'shutter' to selectively permit or block passage of the electron beam 34 to the ion chamber 18. By switching the electron focusing lens 28 to a different voltage it can be made to act as a 'gate', allowing or denying the electrons from reaching the ion source as required.

In an initial state the lens is set to 'pass' in which a first negative voltage is applied to the electron focusing lens 28. The first voltage is selected such that it is sufficiently negative to focus the electron beam while still allowing passage of the beam through the lens 28. The configuration of the central aperture of the lens 28 is such that the electrostatic field generated causes the electrons travelling towards the lens 28 to experience a repulsion force perpendicular to their movement towards the ion source chamber 18 which is directed radially inwards towards the aperture 61 of the lens 28. This field 'presses' the electrons into a narrow beam and directs them to pass through the lens 28. The compression of the electrons focuses them and increases the number of electrons that enter the ion source chamber 18. As such the efficiency and accuracy of ionisation within the chamber 18 is increased.

In a second state the electron focusing lens 28 is set to 'stop' to prevent the flow of electrons to the ion source chamber 28. To set the lens 28 to stop a second negative voltage is applied to the electron focusing lens 28 that is greater (i.e. more negative) than the first voltage. Due to the larger negative repulsion voltage, approaching electrons are prevented from passing through the electron focusing lens 28 due to electron repulsion and instead dissipate. As such, the flow of the electron beam 34 through the lens 28 is stopped and hence the flow of electrons to the ion source chamber 18 is halted and further ion generation is stalled.

In one embodiment ion detection may be conducted on a cyclical basis through a series of 'scans'. Each scan is an individual data capture event commencing with the ionisation of molecules within the target zone. The electron focusing lens 28 is then operated as a shutter to halt ionisation and the ions are then extracted from the ion source 18 and propagated through the flight regions as described above. The scan concludes with the detection of the ions at the detector. The data acquisition frequency of the system is determined by the period of the scan. For example, for a scan period of around 100 μs the native data rate of the system will be approximately 10,000 Hz.

A relatively low quantity of ions is accumulated during a single scan, and as such any analysis based on a single scan alone would be subject to large statistical errors and would therefore be of limited use. It is also undesirable to acquire data from a single scan alone as the requirement to write data to a storage device for each scan period (i.e. every 100 μs) would result in extremely large and unmanageable file sizes. To avoid these problems the system sums the detected signals from multiple contiguous scans into 'scansets' with the accumulated signal being statistically more significant. Each scanset is then recorded as a single data point rather than multiple data points from each scan.

The number of scans that are summed to form a scanset may be selectively varied depending, for example, on chromatographic conditions. It has been found that it is preferable to acquire at least 5 data points for each GC peak, although the system may be operated below this parameter. Therefore, if the GC system typically gives peaks approximately 3 seconds wide and a data point value of 6 per peak is required, a 'scans per scanset' value of approximately 5000 would be set, which leads to a scanset every 5000*100 μs=0.5 s. This provides two data points a second which in turn gives around 6 data points for each peak. Therefore, following each scan the electron focusing lens 28 is re-opened to permit further ionisation and the scan cycle continues.

This may be varied depending on the system, and for example in GCxGC systems the peaks are far narrower and so a much greater scanset rate is required. Here a scanset rate of up to around 100 Hz may be used, or one scanset every 0.01 s. At this speed a scanset is comprised of 100 scans.

Between the scans and also between the scansets a pause in the ionisation may be provided by utilising preferentially the electron focusing lens 28 as a shutter in the closed state in which ionisation is halted. However, all other electrically chargeable elements in the pathway of the electron beam could also be used as a shutter: reflector, filament, focusing lens, extractor, ionisation chamber. Even a separate shutter element is conceivable. The duration of the pause between scans and between scansets can be different. The pause between scansets may be utilised to vary the electron ionisation voltage before the next scanset is commenced. Voltages controlling the reflector plate 26, extractor 36 and electron focusing lens 28 could be adjusted within the scanset pause, with the scanset pause period being selected to ensure a sufficiently stable voltage establishes before recommencement of the next scanset and subsequent data collection. In one embodiment, as shown in FIG. 8, a first scanset may be conducted at an electron acceleration voltage of 15V. During the first scanset pause the accelerating voltage is then increased to 70V and the next scanset is then conducted at the elevated voltage. During the second scanset pause the voltage is then reduced to 15V and this cycle of raising and lowering the accelerating voltage is continued on an intermittent alternating basis.

The electron voltage may be effectively varied between scansets by varying the bias voltage of the filament 22 relative to the ion chamber 18 which defines the energy of the ionising electrons. As the optimum voltages for the extractor and electron focusing lens 28 may vary with different ionisation energies, it could also be necessary to change these values alongside the voltage of the filament 22.

By selectively varying the voltage of the filament between scansets between two or more voltage values, multiple ionisation energies ($E_x$) may be applied in a single analytical experiment, rather than a given sample needing to be analysed at one electron energy and a re-analysis being performed at a second or further electron energy. The rapid cyclical alternation of electron energies during a single sample analysis is enabled by the electron focusing lens 28 operating as a shutter halting ionisation between the scans and scansets, providing the scanset pause, and by the extractor 36 which enables analytically viable measurements to be made at soft ionisation energies by increasing electron density and hence ionisation efficiency at these lower energies. While soft ionisation may be conducted by alternative means, such as chemical ionisation, and with reasonable efficiency, such techniques do not permit the ionisation energy to be varied during an analysis run as this would require a substitution of the ionisation gas which could not be effected in the required time periods. In addition, chemical ionisation allows only certain discrete ionisation energies, whereas the present invention permits any desired ionisation energy to be achieved within the voltage parametric range of the device.

The alternation of the electron acceleration voltages between adjacent scansets supports the simultaneous production of two full sets of spectra; one ionised at $E_1$ and the other at $E_2$. However, it will be appreciated that the ability to selectively vary the ionisation energy during an analysis could be applied in a variety of other ways. For example the ionisation energy could be selectively varied at a given predetermined time during the measurement of a sample.

For an alternating two voltage analysis, it would be preferable to double the overall scanset rate to maintain the correct number of data points for each peak and ionisation energy. In effect, the same number of detected ions would be 'shared' between both ionisation energies. This would lead to each result having 50% of the intensities seen using one constant ionisation energy. However, in many cases the benefits provided by the information from the second set of results would far outweigh the drawbacks from any decrease in sensitivity of each result.

It will be appreciated that while given electron energies are cited above by way of example, it is contemplated that the system could operate using any desired number of ionisation energies during an analysis and in any given order or period during the analysis. For example, rather than sampling at $E_1$ and $E_2$ on a continually alternating basis, data could be collected with ionisation energy $E_1$ concurrently with $E_2$ for the first section of a measurement, before moving on to collect with $E_1$ and $E_3$ for a later section. As such ionisation may be achieved at any energy or set of energies, either simultaneously or sequentially within the same measurement. Combined with the ability to ionise at soft electron voltages a powerful and highly flexible tool is provided for the simultaneous accumulation of both hard and softly ionised sample data.

Space charge effects hinder electron production and so reduce ionisation. The present invention negates or mitigates the effects of space charge limited emission by extracting the electron cloud with a high field. Subsequent to the extraction the electrons are automatically decelerated while approaching the ion chamber. This allows low electron energies in the target region while maintaining a high electron production at the emitter.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

It will be appreciated that in further embodiments various modifications to the specific arrangements described above and shown in the drawings may be made. For example, while specific values of voltages and time periods are described above by way of example, which may be advantageous for the specific embodiments described, it will be appreciated that the invention is not limited to the application of these values which may be varied depending on the specific application of the invention. In addition, while a specific TOF system is described above by way of example, the system is not limited to use with such a system. Furthermore, it is emphasised that the ionisation technique is not limited to use with TOF mass spectrometry and it is contemplated that this system could be utilised for any application requiring ionisation of molecules and in particular where soft ionisation is required and/or the ability to switch between ionisation voltages within a single sample analysis.

The invention claimed is:

1. An analytical apparatus comprising:

an electron impact ionizer including:

an electron emitter;

an ionization target zone, arranged to be populated with matter to be ionized; and an electron extracting element aligned with an electron pathway defined between the electron emitter and the ionization target zone;

wherein the electron extracting element is configured to accelerate electrons away from the emitter along the electron pathway between the emitter and the extracting element and to decelerate the electrons along the electron pathway between the extracting element and the ionization target zone.

2. The analytical apparatus according to claim 1 further comprising a voltage supply for generating a positive potential difference between the emitter and the ionization target zone to cause the emitted electrons to move towards the ionization target zone along the electron pathway, and creating a positive potential difference between the emitter and the electron extracting element, wherein the positive potential difference between the emitter and the electron extracting element being greater than the positive potential difference between the emitter and the ionization target zone such that the electrons accelerate towards the electron extracting element between the emitter and the electron extracting element and decelerate between the electron extracting element and the ionization target zone.

3. The analytical apparatus according to claim 2, wherein the voltage supply is configured to generate a potential difference between the emitter and the ionization target zone between 5 and 30V to generate an electron energy at the ionization target zone of between 5 and 30 eV.

4. The analytical apparatus according to claim 2, wherein the voltage supply is configured to generate a potential difference between the emitter and the ionization target zone between 5 and 25V to generate an electron energy at the ionization target zone of between 5 and 25 eV.

5. The analytical apparatus according to claim 2, wherein the voltage supply is configured to generate a potential difference between the emitter and the ionization target zone of 14V to generate an electron energy at the ionization target zone of 14 eV.

6. The analytical apparatus according to claim 1, wherein the electron extracting element comprises at least one aperture which is aligned with the electron pathway to permit the passage of electrons therethrough.

7. The analytical apparatus according to claim 6, wherein the electron extracting element comprises an electrically conductive plate having an aperture formed therethrough which is aligned with the electron pathway.

8. The analytical apparatus according to claim 6, wherein the extracting element comprises a grid construction defining a plurality of apertures.

9. The analytical apparatus according to claim 1 further comprising an electron reflector arranged to repel electrons emitted from the electron emitter in the direction of the ionization target zone along the electron pathway.

10. The analytical apparatus according to claim 9, wherein the electron reflector is an electrically chargeable element which in use is negatively charged and positioned on the opposing side of the electron generator to the ionization target zone to repel electrons in the direction of the ionization target zone.

11. The analytical apparatus according to claim 1 further comprising electron focusing means configured to focus the emitted electrons along the electron pathway.

12. The analytical apparatus according to claim 11, wherein the electron focusing means comprises an electrically conductive plate having a focusing aperture extending therethrough which is aligned with the electron pathway, the plate in use is negatively charged to provide a repulsive force to focus the electrons.

13. The analytical apparatus according to claim 11, wherein the electron focusing means is located between the emitter and the electron extracting element to focus the electrons prior to passage through the electron extracting element.

14. The analytical apparatus according to claim 11, wherein at least a portion of the electron focusing means surrounds the electron emitter.

15. The analytical apparatus according to claim 11, wherein the electron focusing element comprises a main body section and a wall section extending from the surface of the main body section in the direction of the electron emitter, the wall section defining an enclosure having a distal open end extending towards the electron emitter and a proximal open end surrounding the focusing aperture.

16. The analytical apparatus according to claim 15, wherein the distal open end of the wall section substantially surrounds the electron emitter in at least one plane.

17. The analytical apparatus according to claim 16, wherein the wall section is a tubular section having an inner wall surface defining a channel between the distal open end and the focusing aperture.

18. The analytical apparatus according claim 1, wherein the electron emitter comprises a filament configured to be heated to generate electrons through thermionic emission.

19. The analytical apparatus according to claim 1 further comprising an ionization chamber having an internal volume defining the ionization target zone, the chamber comprising an electron inlet aligned with electron pathway arranged to permit entry of electrons emitted from the electron emitter into the ionization chamber, and a gas inlet configured to permit the flow of gas phase analyte molecules into the chamber for ionization.

20. The analytical apparatus according to claim 1 further comprising an electron beam shutter configured to selectively stop or permit the flow of electrons to the ionization target zone from the electron emitter.

21. The analytical apparatus according to claim 11, wherein the electron focusing means is configured to be variably charged to operate as an electron beam shutter to selectively stop or permit the flow of electrons to the ionization target zone from the electron emitter for varying charge states.

22. An analytical system comprising an analytical apparatus according to any preceding claim, the apparatus including means for generating a positive potential difference between the emitter and the ionization target zone to cause the emitted electrons to move towards the ionization target zone along the electron pathway, and a positive potential difference between the emitter and the electron extracting element greater than the positive potential difference between the emitter and the ionization target zone such that the electrons accelerate towards the electron extracting element between the emitter and the electron extracting element and decelerate between the electron extracting element and the ionization target zone, wherein the system comprises a controller programmed to apply a potential difference between the emitter and the ionization target zone in the region of 5 to 30V to generate an electron ionization energy at the ionization target zone between 5 and 30eV.

23. The analytical system according to claim 22, wherein the controller is programmed to also apply a potential difference between the emitter and the ionization target zone of 70V to generate an electron ionization energy at the ionization target zone of 70 eV, and to switch the applied potential difference between first value of 70V and second value selected from the range 5 to 30V.

24. The analytical system according to claim 23 further comprising an electron beam shutter configured to selectively stop or permit the flow of electrons to the ionization target zone from the electron emitter, and wherein the controller is programmed to switch the potential difference between the emitter and the ionization target zone between the first and second values in the period during which the electron beam is stopped by the shutter to enable selectively intermittent hard and soft ionization of the analyte molecules.

25. The analytical system according to claim 24, wherein the second value is selected from the range 5 to 25V.

* * * * *